Figure 1:
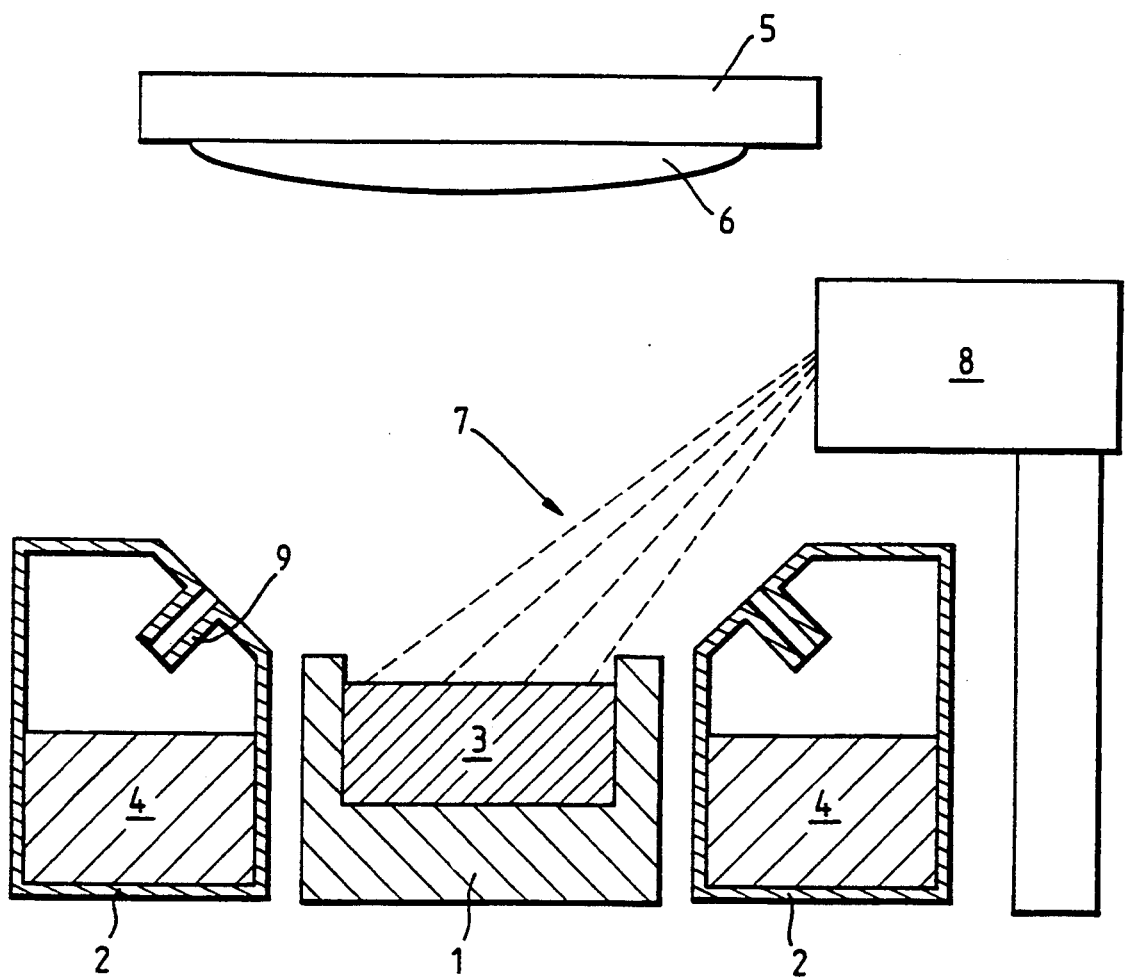

United States Patent [19]

Bishop et al.

[11] Patent Number: 5,348,703
[45] Date of Patent: Sep. 20, 1994

[54] VAPOR DEPOSITION APPARATUS AND METHOD

[75] Inventors: Alan W. Bishop; David J. Bray, both of Farnborough; Robert W. Gardiner, Farnham; Brian W. Viney, Farnborough, all of United Kingdom

[73] Assignee: The Secretary of the State for Defence in Her Britannic Majesty's Government of the United Kingdom of Great Britain and Northern Ireland, Hants, England

[21] Appl. No.: 39,409

[22] PCT Filed: Oct. 11, 1991

[86] PCT No.: PCT/GB91/01771
§ 371 Date: Apr. 21, 1993
§ 102(e) Date: Apr. 21, 1993

[87] PCT Pub. No.: WO92/07103
PCT Pub. Date: Apr. 30, 1992

[30] Foreign Application Priority Data

Oct. 16, 1990 [GB] United Kingdom ............... 9022449

[51] Int. Cl.$^5$ .................. C22C 1/00; C21B 11/10
[52] U.S. Cl. .................. 420/590; 75/10.29; 266/206
[58] Field of Search .......... 75/10.29; 420/590; 266/206, 207

[56] References Cited

U.S. PATENT DOCUMENTS

| | | | |
|---|---|---|---|
| 3,607,222 | 9/1971 | Kennedy | 75/10.29 |
| 4,517,027 | 5/1985 | Bickerdike | 420/590 |
| 4,548,670 | 10/1985 | Pinkhasov | 75/10.29 |
| 4,626,410 | 12/1986 | Miura | 420/590 |
| 4,708,190 | 11/1987 | Hack | 75/10.29 |

FOREIGN PATENT DOCUMENTS 1265965 3/1972 United Kingdom.
2230792 10/1990 United Kingdom.

*Primary Examiner*—Peter D. Rosenberg
*Attorney, Agent, or Firm*—Nixon & Vanderhye

[57] ABSTRACT

Apparatus for the physical vapor deposition of an alloy whose constituent elements have widely differing vapor pressures comprises an inner evaporation crucible (1) surrounded by a second evaporation crucible (2) having an array of nozzles (9) angled towards collector (5). In use of the apparatus, a charge (3) of relatively low volatility is evaporated from inner crucible (1) using an electron beam (7) focussed by magnet (8). Charge (4) in second crucible (2) is of much higher volatility and is evaporated by radiant heating. The nozzles (9) direct the vapor from charge (4) along pathways which intersect the vapor rising from charge (3) such that the combined vapor stream reaching collector (5) is an intimate mixture of constituents. The nozzles (9) may also serve to control the flow rate of vapor from the second crucible (2).

10 Claims, 3 Drawing Sheets

VAPOR DEPOSITION APPARATUS AND METHOD

BACKGROUND OF THE INVENTION

1. Field of the Invention

The present invention relates to an improved apparatus and method for the production of alloys by a physical vapour deposition process generally as described in our earlier British Patents GB 1206586 and GB 1265965. In such a process, the apparatus is operated under vacuum within a vacuum chamber and the alloy constituents are evaporated from one or more evaporation baths before being caused to condense upon a temperature-controlled collector.

The apparatus and method described here are suitable for producing alloys in substantial quantities and with sufficient structural integrity that the deposits may be removed from the collector intact. The deposit can then be worked into sheet, strip or other wrought form and heat-treated to achieve the desired mechanical properties. As with conventionally-cast alloys, the deposited alloy may be heat-treated before, during or after working. Alternatively, the deposited alloy may be removed and pulverized for subsequent powder metallurgical techniques, for example when it is desired to produce an article close in form to the intended final shape.

2. Discussion of Prior Art

Recently, interest has grown in the possibility of obtaining improved magnesium alloys by creating new compositions using rapid solidification rate (hereinafter referred to as RSR) production processes. Although magnesium is the lightest of the structural metals, its alloys have yet to find widespread use in aerospace applications, partly because of certain shortcomings in their mechanical properties, but principally because of their poor corrosion resistance. In magnesium alloys produced by conventional non-RSR methods the addition of elements such as aluminium, chromium or silicon is ineffective in improving the corrosion resistance even though such additives are known to form protective surface films in other alloy systems. This inefficacy is due to their poor solubilities in the magnesium matrix: Under normal equilibrium conditions the concentration of such additives in solid solution is tool low to provide an effective barrier to corrosion.

In magnesium alloys it is generally believed that corrosion-inhibiting additives should be incorporated in the form of solid solutions so that a uniform electrode potential is maintained throughout the alloy. If the additives are allowed to segregate and form precipitates, and if the precipitates have a different electrode potential from the matrix, then they effectively behave as tiny Galvanic cells and corrosion resistance is worsened rather than improved.

Rapid solidification techniques including vapour deposition provide the means to overcome equilibrium thermodynamic constraints and achieve compositions which are beyond the scope of the ingot metallurgist by "freezing" constituent atoms in position before they have the opportunity to migrate and segregate as they would in conventional ingot processes. These techniques therefore offer a possible route to improved corrosion resistance in magnesium alloys by allowing an increase in the population of corrosion-inhibiting species in the magnesium alloy without forming harmful precipitates.

Physical vapour deposition is favoured over other forms of RSR processing for a number of reasons. Firstly, the cooling rate is very much higher in physical vapour deposition and thereby increases the likelihood of formation of solid solutions. Secondly, physical vapour deposition offers a considerable choice of potential alloying constituents since the candidate elements are raised to the vapour state, thereby ensuring miscibility between different constituents. By contrast, other forms of RSR processing are limited in the possible combinations of alloying constituents which they can offer to those elements which are miscible in the molten state. This is a particularly important consideration in the case of magnesium since, at the melting temperature of many potentially interesting alloying additions, magnesium has a very high vapour pressure and hence evaporates very quickly.

The use of physical vapour deposition to prepare magnesium alloys containing additives such as aluminium, chromium or silicon is not without its problems, however, owing to the large differences between the vapour pressure of magnesium and the vapour pressures of the additives. Where uniform composition of the deposit is a prime requirement, it is preferable to use a single evaporation source, but when the alloy constituents have vapour pressured differing by several orders of magnitude, as in the magnesium-chromium system for example, single source evaporation is no longer practicable. In these circumstances, separate sources are required and the design of the apparatus becomes more complicated. If separate sources are arranged side-by-side the composition of the deposit is non-uniform across the substrate due to imperfect mixing of the vapour streams. Better mixing can be achieved by increasing the separation of the collector from the sources but this has the effect of lowering the deposition rate.

Another way of minimising non-uniformity is to introduce lateral movement between the relative positions of the collector and the sources. In practice, it is easier to keep the sources stationary and to move the collector, either by rotation or by a reciprocating motion, thereby ensuring that exposure of different parts of the substrate to the respective sources is equalized. Whist a moving collector offers considerable benefit in improving the homogeneity of the deposit, a small degree of non-uniformity is inevitable because the deposit is effectively laid down as a series of sub-layers which are alternatively rich in one particular constituent. In a structural member even this level of non-uniformity could be critical to its overall strength and might also be bad from the point of view of corrosion resistance.

In an earlier British Patent Application number GB 2 230 792 A we describe a method suitable for producing magnesium alloys by physical vapour deposition which uses separate evaporation sources mounted on a vertical axis wherein the sources are arranged to discharge their respective vapours into a heated chimney. The chimney is maintained at a temperature which is at least as high as the temperature of the hottest evaporation source in order to suppress condensation of vapour on the chimney walls. Vapours impinging on the chimney walls are therefore recited, thus promoting vapour mixing. Use of this method is limited to those elements which can be easily evaporated using radiant heating, since the tantalum heaters used to heat the highest temperature evaporation source are rapidly degraded if the temperature of this source exceeds 1450° C. As long as tantalum remains the material of choice for such heaters then the operating temperature range will be limited to this ceiling, so for the evaporation of certain potentially useful alloying additions other methods must be devised.

SUMMARY OF THE INVENTION

It is therefore an aim of this invention to provide an apparatus and method for the physical vapour deposition of bulk alloys from multiple evaporation sources which promotes intimate mixing of the vapour streams from the respective sources prior to deposition in order to achieve homogeneity in the deposit. It is a further aim of the invention to provide an apparatus and method for the physical vapour deposition of bulk alloys which has the capability to evaporate elements having low vapour pressures without degradation of the heaters employed.

In a first aspect the invention is an apparatus for the production of an alloy by a process of evaporating the alloy constituents under vacuum and condensing the constituent vapours on a collector, the apparatus comprising two heated evaporation crucibles, heating control means for independently regulating the temperatures of charges in the evaporation crucibles at the desired levels to maintain appreciable vapour pressures and generate rising streams of vapour from the respective charges, and a temperature-controlled collector positioned such that it captures the vapours emitted from the evaporation crucibles, characterised by the following features in combination:

a first evaporation crucible having an open top;

an electron beam heater to heat the charge in the first evaporation crucible;

a second evaporation crucible which encircles the first evaporation crucible;

radiant heating means to heat the charge in the second evaporation crucible, and a closure for the second evaporation crucible, which closure is equipped with an array of nozzles spaced around a collector-facing surface thereof, the nozzles being oriented to direct the streams of vapour from the second evaporation crucible along convergent pathways which intersect the vapour stream emitted from the first evaporation crucible to facilitate mixing between the respective vapour streams before they are captured by the collector.

In another aspect the invention provides a method of producing an alloy by a process of evaporating the alloy constituents under vacuum and condensing the constituent vapours on a collector, the method comprising evaporating a charge of a first alloy constituent or constituents from a first evaporation crucible, allowing the vapour flux from the first evaporation crucible to rise towards the collector, evaporating a charge of a further alloy constituent or constituents from a second evaporation crucible, and maintaining the flow of constituent vapours from the respective evaporation crucibles by continued heating of the charges in order to ensure that the vapour which is captured by the collector is made up of vapours from the first and second evaporation crucibles, characterised by the following steps in combination:

loading the first evaporation crucible with a charge of a constituent or constituents of relatively low volatility;

heating the charge in the first evaporation crucible with an electron beam;

loading the second evaporation crucible with a charge of a constituent or constituents of relatively high volatility;

heating the charge in the second evaporation crucible with radiant heating means, and directing the vapour from the second evaporation crucible in streams through a series of convergently-directed nozzles arranged in an array around the first evaporation crucible such that these streams are caused to flow towards the collector along pathways which intersect the rising vapour flux from the first evaporation crucible to facilitate mixing between the respective vapours before they are captured by the collector.

In a third aspect, the invention provides a method of producing an alloy by a process of evaporating the alloy constituents under vacuum and condensing the constituent vapours on a collector, the method comprising evaporating a charge of a first alloy constituent or constituents from a first evaporation crucible, allowing the vapour flux from the first evaporation crucible to rise towards the collector, evaporating a charge of a further alloy constituent or constituents from a second evaporation crucible, and maintaining the flow of constituent vapours from the respective evaporation crucibles by continued heating of the charges in order to ensure that the vapour which is captured by the collector is made up of vapours from the first and second evaporation crucibles, characterised by the following steps in combination:

loading the first evaporation crucible with a charge of a constituent or constituents of relatively low volatility;

heating the charge in the first evaporation crucible with an electron beam;

loading the second evaporation crucible with a charge of a constituent or constituents of relatively high volatility;

heating the charge in the second evaporation crucible with radiant heating means to a temperature sufficiently high to cause boiling and thereby disperse surface oxide scale;

controlling the flow rate of the vapour emitted from the second evaporation crucible by passing it through a series of choking nozzles arranged in an array around the first evaporation crucible, and directing the vapour streams emitted from the choking nozzles by orientation of the choking nozzles along pathways which intersect the rising vapour flux from the first evaporation crucible to facilitate mixing between the respective vapours before they are captured by the collector.

In order to ensure that the nozzles do not become blocked by unwanted condensation of vapour, the closure or lid in which they are located is preferably heated independently from the body of the second evaporation crucible to a temperature which is higher than the crucible temperature. In an especially preferred form of the invention, the nozzles are of re-entrant form so that the major part of the nozzle body is located within the crucible, thereby minimizing the effects of cooling. As a further measure to cut down cooling effects, the surface of the crucible lid between the nozzles may be coated with a ceramic paste which serves as an insulating layer. By these measures, a temperature gradient is established which encourages flow of vapour in the desired direction. This is particularly important when the apparatus is being raised to operating temperature from cold.

Our previous work with physical vapour deposition of magnesium has shown that an oxide layer on the surface of the molten metal hinders its evaporation below certain temperatures, giving an unacceptably low rate of deposition. By increasing the temperature of the second evaporation crucible, this oxide becomes dispersed to the edges of the crucible, leaving a clean pool of molten metal which can then be readily evaporated. At the temperatures which cause this oxide dispersion the vapour pressure of magnesium is very high so the dimensions of the nozzles must be chosen such that the desired flow rate of magnesium vapour from the second evaporation crucible is obtainable by regulating the temperature of the crucible above this oxide dispersion temperature.

Typically, the deposition rate is regulated to between 2 and 4 mm per hour, although it is possible to increase this rate to 6 mm per hour or even greater. One of the drawbacks of higher deposition rates is that there is an increased tendency for the deposit to exhibit porosity so in practice the deposition rate is optimised to achieve a sensible microstructure. Where high rates of deposition are necessary for commercial reasons, for example in large scale manufacturing plant, such porosity can be largely eliminated by mechanically working the deposit at intervals during its deposition in order to flatten surface asperities. In a moving collector apparatus, such mechanical working is preferably carried out after each pass of the collector over the evaporation sources. This ensures that the vapour stream always impinges on a flat surface which is free from columnar growth.

BRIEF DESCRIPTION OF THE FIGURES

The invention will now be described by way of example only with reference to the drawings, in which:

FIG. 1 is a schematic diagram showing a general layout for the apparatus of the invention;

FIG. 2 is a plan view of a preferred form of the apparatus, and

FIG. 3 is a sectional view on line XX' of FIG. 2.

DETAILED DESCRIPTION OF PREFERRED EMBODIMENTS

Referring now to FIG. 1, there is shown an inner evaporation crucible 1 surrounded by a second evaporation crucible 2. The inner evaporation crucible 1 contains a charge 3 of a relatively low volatility constituent whilst second evaporation crucible 2 is charged with a much higher volatility constituent 4, such as magnesium. The crucibles are centrally positioned under a collector 5 on which a deposit 6 is accumulated.

In use of the apparatus, the charge 3 in the inner evaporation crucible 1 is heated using an electron beam 7 focussed by magnet 8 to a temperature which causes a stream of vapour to rise towards collector 5. Second evaporation crucible 2 is heated by radiant heaters (not shown) to generate an appreciable vapour pressure in the magnesium 4, such that streams of magnesium vapour are discharged towards the collector 5 through nozzles 9. The nozzles 9 are angled towards the collector 5 so that the streams of magnesium vapour intersect the stream of vapour rising from the inner evaporation crucible 1. This ensures that the combined vapour impinging on the collector 5 is an intimate mixture of constituents. Each stream of magnesium vapour diverges after it leaves its respective nozzle 9 so the spacing between individual nozzles and their separation from the collector 5 is arranged such that a uniform population of magnesium atoms is delivered to the collector across a large proportion of its total surface area. The separation between the inner evaporation crucible 1 and the collector 5 is also chosen to give uniform coverage over as much of the collector as possible.

FIGS. 2 and 3 show a preferred form of the apparatus in plan view and sectional view, respectively. Here the inner evaporation crucible 10 is shown as a water-cooled copper crucible which is surrounded by an annular steel crucible 20. Annular steel crucible 20 is covered with a steel lid 21 having eight nozzles 40 disposed around its inner circumference, which nozzles are convergently directed towards a collector (not shown) positioned above the inner crucible 10.

The nozzles 40 are of re-entrant form, having their bodies protruding into the chamber defined by the annular steel crucible 20 and its lid 21, thereby ensuring that heat losses through the nozzles are kept to a minimum. Annular steel crucible 20 is itself surrounded by an arrangement of four ceramic bricks 24, 25, 26 and 27 which are fastened together by retaining clips 28. These bricks then form a complete ring serving as a support for radiant heater 30 which is housed in grooves 29 formed on the interior faces of the ceramic bricks. The steel lid 21 is similarly covered by a ceramic ring 31 which has grooves 32 formed on its underside for retention of a second radiant heater 33.

Radiant heaters 30 and 33 may be formed from an iron/aluminium alloy such as Kanthal S (Registered Trade Mark) or from tantalum. In order to minimise magnetic disturbance to the electron beam (not shown) which is used to evaporate constituents from the inner evaporation crucible 10, these radiant heaters are preferably configured in the form of return loops. This ensures that the large currents carried by the heating elements during operation of the apparatus do not generate biassing magnetic fields.

Thermocouples 34 are attached to the base of the annular steel crucible 20 to monitor its temperature, and to minimise thermal conduction away from the annular steel crucible 20 by the coolant water circulating around inner evaporation crucible 10 a pack of thermally insulating screens 35 is inserted between the crucibles. Further screens (not shown) may also be placed over the top of the top surface of the water-cooled crucible as an additional measure to minimise thermal conduction away from the annular steel crucible 20. Depending on the particular constituents to be evaporated, and consequently the temperature differences expected between the crucibles, screens 35 may be formed from molybdenum, stainless steel or possibly ceramic fibre materials.

For deposition of a magnesium alloy such as a magnesium/transition metal element alloy, a charge of magnesium metal is placed in annular steel crucible 20 and the temperature of the crucible is then raised to between 700° and 800° C. using the radiant heater 30. Radiant heater 33 is independently controlled to heat the steel lid 21 to a temperature which is greater than that of the crucible by at least 50° C., but preferably by about 100° C., to reduce the risk to nozzles 40 of blockage by undesired condensation of magnesium vapour. At this operation temperature of 700°–800° C. for the crucible the surface of the magnesium is free of oxide film and an appreciable vapour pressure of magnesium builds up inside the crucible. The escape of magnesium vapour from the crucible is attenuated by the nozzles 40 which are dimensioned to give a satisfactory flow rate for effective performance of the deposition process.

Figure 2:
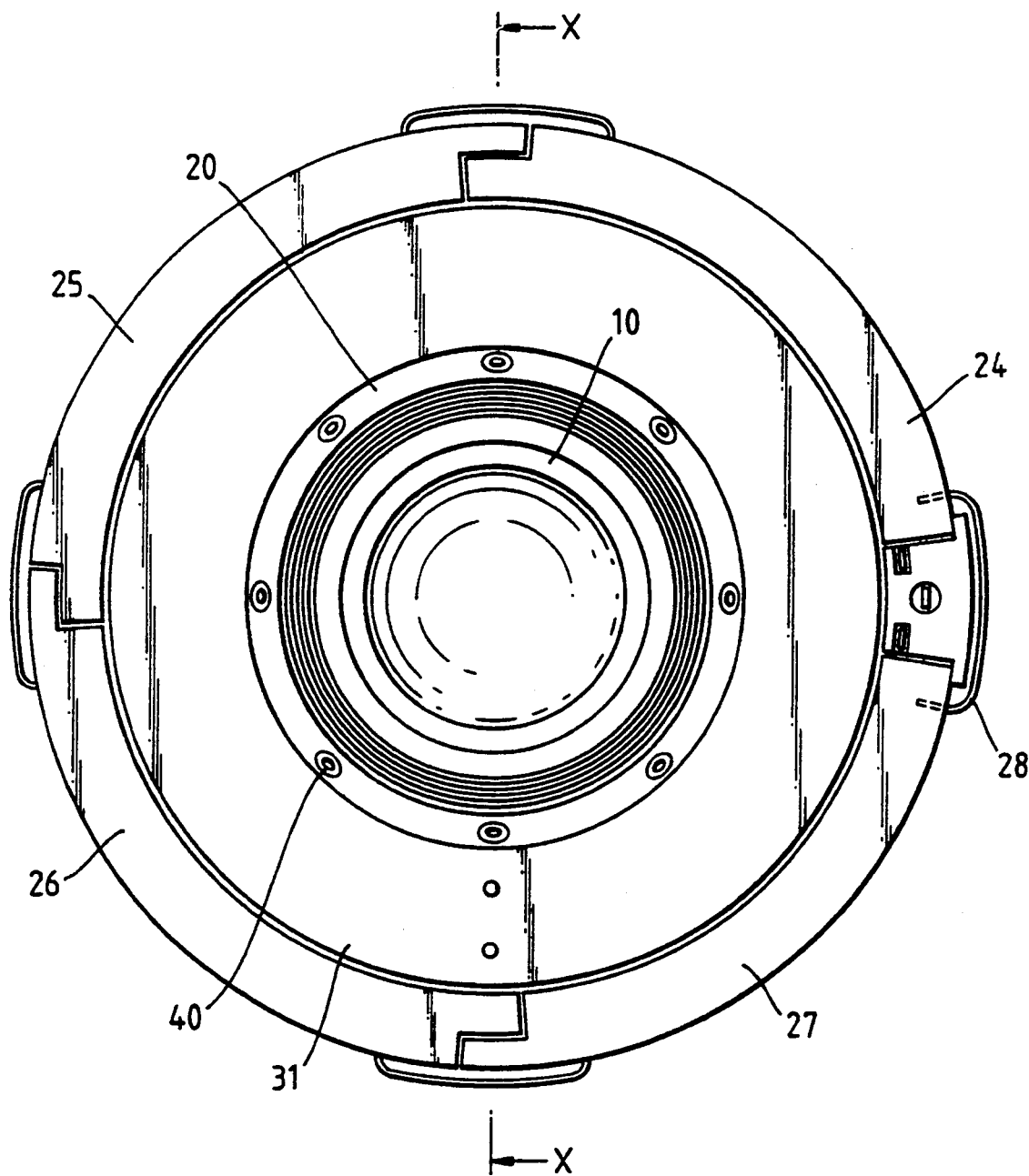
Figure 3:
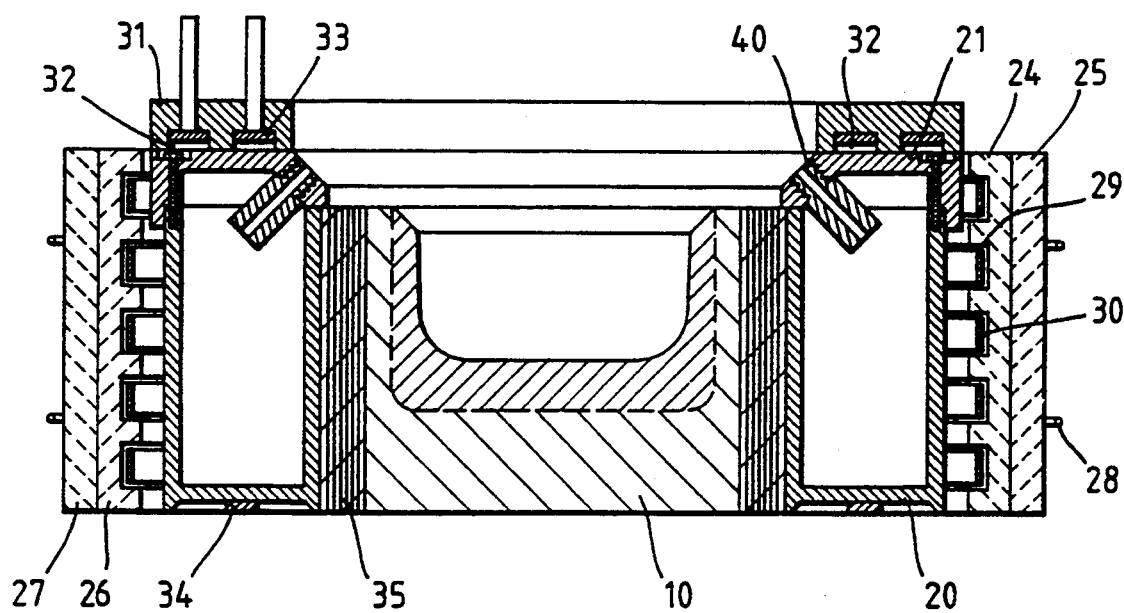

The inner evaporation crucible 10 is loaded with a charge of the desired transition metal element or elements and the surface of this charge is bombarded with an electron beam to effect evaporation. The water cooled copper crucible shown here in FIGS. 2 and 3 is universally applicable for the evaporation of all potential alloying additions but suffers from the drawback that it conducts heat away from the evaporation surface and is therefore inefficient in its use of energy. Some alloying additions can be evaporated from graphite or ceramic crucibles, provided that chemical reaction between the crucible material and the alloying addition is not too severe. For this reason, those elements which have a high affinity for oxygen are unlikely to be suitable for evaporation from a ceramic crucible and similar limitations apply to the use of a graphite crucible with elements which readily form carbides.

Initially, a shutter (not shown) is used to screen the collector from the evaporation sources until an equilibrium condition is reached where steady flow rates of the magnesium and constituent vapours are achieved. The shutter is then opened and the collector is exposed to the vapour mixture until the deposit has reached the required thickness, at which point the shutter is closed again. The radiant heaters and electron beam are turned off and the deposit is allowed to cool before removal from the collector for further processing.

In an alternative form of the apparatus, the central crucible can be configured as a water-cooled annulus which is fed by an alloy rod in accordance with known techniques. This imparts greater flexibility to the apparatus as it allows semi-continuous deposition rather than the batch deposition which results from using a single charge in a conventional crucible.

Although the apparatus and method have been particularly described with reference to the deposition of magnesium alloys, they are equally suited to other alloy systems where one of the constituents has a much higher vapour pressure than the other ingredients, for example in zinc-based alloys.

We claim:

1. Apparatus for the production of an alloy by a process of evaporating the alloy constituents under vacuum and condensing the constituent vapours on a collector, the apparatus comprising:
   first and second heated evaporation crucibles,
   heating control means for independently regulating the temperatures of charges in the evaporation crucibles at the desired levels to maintain appreciable vapour pressures and generate rising streams of vapour from the respective charges,
   a temperature-controlled collector positioned such that it captures the vapours emitted from the evaporation crucibles, wherein
   said first evaporation crucible has an open top and said heating control means includes an electron beam heater for heating the charge in the first evaporation crucible;
   said second evaporation crucible encircles the first evaporation crucible p1 said heating control means further includes radiant heating means for heating the charge in the second evaporation crucible; and
   a closure for the second evaporation crucible, which closure is equipped with an array of nozzles spaced around a collector-facing surface thereof, the nozzles comprising a means for directing streams of vapour from the second evaporation crucible along convergent pathways which intersect vapour streams emitted from the first evaporation crucible and for facilitating mixing between the respective vapour streams before said streams are captured by the collector.

2. Apparatus as claimed in claim 1 wherein said radiant heating means comprises separate radiant heaters for the second evaporation crucible and the closure, respectively.

3. Apparatus as claimed in claim 2 wherein said radiant heaters for the second evaporation crucible and the closure are independently controllable.

4. Apparatus as claimed in claim 1 wherein said nozzles are of re-entrant form with a major part of each nozzle disposed within a chamber defined by the second evaporation crucible and the closure.

5. A method of producing an alloy by a process of evaporating the alloy constituents under vacuum and condensing the constituent vapours on a collector, the method comprising the steps of:
   evaporating a charge of a first alloy constituent or constituents from a first evaporation crucible,
   allowing the vapour flux from the first evaporation crucible to rise towards the collector,
   evaporating a charge of a further alloy constituent or constituents from a second evaporation crucible, and
   maintaining the flow of constituent vapours from the respective evaporation crucibles by continued heating of the charges in order to ensure that the vapour which is captured by the collector is made up of vapours from the first and second evaporation crucibles,
   wherein prior to said first alloy evaporation step, there are included the additional steps of:
   loading the first evaporation crucible with a charge of a constituent or constituents of relatively low volatility; and
   heating the charge in the first evaporation crucible with an electron beam;
   wherein prior to said further alloy evaporating step, there are included the additional steps of:
   loading the second evaporation crucible with a charge of a constituent or constituents of relatively high volatility; and
   heating the charge in the second evaporation crucible with radiant heating means, and
   wherein said maintaining step includes the step of directing the vapour from the second evaporation crucible in streams through a series of convergently-directed nozzles arranged in an array around the first evaporation crucible such that these streams are caused to flow towards the collector along pathways which intersect the rising vapour flux from the first evaporation crucible to facilitate mixing between the respective vapours before they are captured by the collector.

6. A method of producing an alloy by a process of evaporating the alloy constituents under vacuum and condensing the constituent vapours on a collector, the method comprising the steps of:
   evaporating a charge of a first alloy constituent or constituents from a first evaporation crucible,
   allowing the vapour flux from the first evaporation crucible to rise towards the collector, evaporating a charge of a further alloy constituent or constituents from a second evaporation crucible, and maintaining the flow of constituent vapours from the respective evaporation crucibles by continued heating of the charges in order to ensure that the vapour which is captured by the collector is made up of vapours from the first and second evaporation crucibles, wherein prior to said first alloy evaporation step, there are included the additional steps of:

loading the first evaporation crucible with a charge of a constituent or constituents of relatively low volatility; and heating the charge in the first evaporation crucible with an electron beam;

wherein prior to said further alloy evaporating step, there are included the additional steps of:

loading the second evaporation crucible with a charge of a constituent or constituents of relatively high volatility; and heating the charge in the second evaporation crucible with radiant heating means to a temperature sufficiently high to cause boiling and thereby disperse surface oxide scale; and controlling the flow rate of the vapour emitted from the second evaporation crucible by passing it through a series of choking nozzles arranged in an array around the first evaporation crucible, and wherein said maintaining step includes the step of directing the vapour streams emitted from the choking nozzles by orientation of the choking nozzles along pathways which intersect the rising vapour flux from the first evaporation crucible to facilitate mixing between the respective vapours before they are captured by the collector.

7. A method as claimed in claim 5 wherein said maintaining step includes maintaining the nozzles at a higher temperature than the second evaporation crucible for preventing unwanted condensation of vapour in the nozzles.

8. A method as claimed in claim 6 wherein said maintaining step includes maintaining the nozzles at a higher temperature than the second evaporation crucible for preventing unwanted condensation of vapour in the nozzles.

9. Apparatus as claimed in claim 2 wherein said nozzles are of re-entrant form with a major part of each nozzle disposed within a chamber defined by the second evaporation crucible and the closure.

10. Apparatus as claimed in claim 3 wherein said nozzles are of re-entrant form with a major part of each nozzle disposed within a chamber defined by the second evaporation crucible and the closure.

* * * * *